United States Patent
Kondoh et al.

(10) Patent No.: US 8,097,398 B2
(45) Date of Patent: Jan. 17, 2012

(54) METHOD FOR MANUFACTURING SEMICONDUCTOR DEVICE

(75) Inventors: Takehiro Kondoh, Yokkaichi (JP); Eishi Shiobara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 419 days.

(21) Appl. No.: 12/477,744

(22) Filed: Jun. 3, 2009

(65) Prior Publication Data

US 2009/0305167 A1    Dec. 10, 2009

(30) Foreign Application Priority Data

Jun. 4, 2008    (JP) ................... 2008-147121

(51) Int. Cl.
- *G03F 7/00* (2006.01)
- *G03F 7/004* (2006.01)
- *G03F 7/26* (2006.01)
- *G03F 7/40* (2006.01)

(52) U.S. Cl. ............ 430/273.1; 430/270.1; 430/311; 430/331; 430/905; 430/913; 430/322

(58) Field of Classification Search ........ 430/270.1, 430/271.1, 311, 273.1, 905, 331, 927, 913, 430/312, 322
See application file for complete search history.

(56) References Cited

U.S. PATENT DOCUMENTS

| | | | |
|---|---|---|---|
| 6,486,058 B1 * | 11/2002 | Chun | 438/637 |
| 6,558,053 B2 * | 5/2003 | Shigemori et al. | 396/611 |
| 6,663,761 B2 * | 12/2003 | Kamijima | 205/122 |
| 6,740,479 B2 * | 5/2004 | Loccufier et al. | 430/488 |
| 6,916,594 B2 | 7/2005 | Bok et al. | |
| 7,141,177 B2 * | 11/2006 | Tanaka | 216/41 |
| 7,147,985 B2 * | 12/2006 | Yueh et al. | 430/270.1 |
| 7,226,726 B2 * | 6/2007 | Kanda | 430/331 |
| 7,335,464 B2 * | 2/2008 | Takano et al. | 430/327 |
| 7,358,037 B2 * | 4/2008 | Cheng | 430/324 |
| 7,527,918 B2 * | 5/2009 | Kondoh et al. | 430/312 |
| 7,662,542 B2 * | 2/2010 | Shiobara et al. | 430/311 |
| 7,799,503 B2 * | 9/2010 | Brodsky et al. | 430/270.1 |

(Continued)

FOREIGN PATENT DOCUMENTS

EP    1152036 A1 * 11/2001

(Continued)

OTHER PUBLICATIONS

Machine translation of JP 2004-077951 A (no date).*

*Primary Examiner* — Amanda C. Walke
(74) *Attorney, Agent, or Firm* — Finnegan, Henderson, Farabow, Garrett & Dunner, L.L.P.

(57) ABSTRACT

In the method for manufacturing a semiconductor device, a resist film is formed on a substrate and is processed to be provided with openings to form a first resist pattern. Additive-containing layers containing an additive that changes a state of the resist film to a soluble state for a developer are formed so as to cover the first resist pattern. A first resin film having a nature of changing to a soluble state for the developer by containing the additive is formed in the openings of the first resist pattern. The additive is diffused into the first resist pattern and the first resin film to form first and second additive-diffusing portions which can be solved in the developer. The first and second additive-diffusing portions are removed by the developer to form second resist pattern made of remaining portions in the first resist pattern and the first resin film.

20 Claims, 13 Drawing Sheets

U.S. PATENT DOCUMENTS

| | | | |
|---|---|---|---|
| 7,851,139 B2 * | 12/2010 | Shiobara et al. | 430/325 |
| 2006/0003601 A1 * | 1/2006 | Sugeta et al. | 438/781 |
| 2006/0127816 A1 | 6/2006 | Kang et al. | |
| 2007/0077524 A1 | 4/2007 | Koh et al. | |
| 2008/0044759 A1 * | 2/2008 | Ishibashi et al. | 430/270.1 |
| 2009/0220892 A1 * | 9/2009 | Iwao et al. | 430/312 |
| 2009/0258318 A1 * | 10/2009 | Chan | 430/312 |
| 2010/0183851 A1 * | 7/2010 | Cao et al. | 428/195.1 |
| 2010/0330498 A1 * | 12/2010 | Bae et al. | 430/270.1 |

FOREIGN PATENT DOCUMENTS

| | | |
|---|---|---|
| EP | 1223470 A1 * | 7/2002 |
| JP | 03-270227 | 12/1991 |
| JP | 2004077951 A * | 3/2004 |

* cited by examiner

METHOD FOR MANUFACTURING SEMICONDUCTOR DEVICE

CROSS-REFERENCE TO RELATED APPLICATION

This application is based upon and claims the benefit of priority from prior Japanese Patent Application No. 2008-147121 filed on Jun. 4, 2008 in Japan, the entire contents of which are incorporated herein by reference.

BACKGROUND OF THE INVENTION

1. Field of the Invention

The present invention relates to a method for manufacturing a semiconductor device.

2. Background Art

A demand for miniaturization of a semiconductor device is addressed until now by methods such as shortening of exposure wavelength and increase in NA (numeric aperture) of an exposure lens in a photolithography process. However, it is becoming difficult to address a demand for fast-paced further miniaturization of a semiconductor device by conventional methods such as shortening of exposure wavelength and increase in NA of an exposure lens.

Consequently, a technique called double patterning is being proposed. Briefly, this technique is an application of multiple exposure. For example, exposure is performed on a resist film once with a mask of a rough pattern. The mask is displaced and exposure is performed again. After that, development is performed.

In this technique, however, precision of alignment of an exposure apparatus at the time of multiple exposure is strictly requested and it is difficult to realize the technique in practice.

A method for forming a fine pattern of a silicon oxide film is also proposed (for example, Japanese Patent Laid-Open No. 1991-270227).

The method will be described as follows.

First, a resist pattern is formed at low pitches on a substrate to be processed. The resist pattern itself has a width corresponding to a predetermined pitch.

Next, a silicon oxide film is formed so as to cover at least the resist pattern.

Further, the silicon oxide film is etched so that the silicon oxide film remains only on both sides of each of the resist patterns. A gap of a predetermined pitch is formed between the silicon oxide films on both sides of neighboring resist patterns.

Subsequently, the resist pattern sandwiched by the silicon oxide films is selectively removed to make the silicon oxide films on both sides remain. As a result, the remaining silicon oxide films are arranged at intervals of the predetermined pitch. That is, a fine pattern having an interval of the pitch which is the half of the low pitch of the initial resist pattern is formed in the silicon oxide film.

SUMMARY OF THE INVENTION

According to an aspect of an embodiment of the present invention, there is provided a method for manufacturing a semiconductor device, comprising: forming a resist film on a substrate and processing the resist film to be provided with openings to form a first resist pattern; forming additive-containing layers so that the additive-containing layers cover a surface of the first resist pattern, the additive-containing layers containing an additive that changes a state of the resist film from a non-soluble state to a soluble state for a developer; forming a first resin film in a state that the first resin film is buried in the openings of the first resist pattern, a state of the first resin film being changed from a non-soluble state to a soluble state for the developer when the first resin film contains the additive, and the openings of the first resist pattern being covered with the additive-containing layers; diffusing the additive into the first resist pattern and the first resin film, respectively, the first resist pattern being covered with the additive-containing layers and being medially-located to the additive-containing layers, and the first resin film being laterally-located to the additive-containing layers, to form first additive-diffusing portions in the first resist pattern and second additive-diffusing portions in the first resin film, the first and second additive-diffusing portions being able to be solved in the developer; and removing the first additive-diffusing portions and the second additive-diffusing portions with the developer, to form a second resist pattern made of remaining portions in the first resist pattern and remaining portions in the first resin film.

BRIEF DESCRIPTION OF THE DRAWINGS

FIG. 1-2 is a schematic process cross section (No. 2) for explaining the method for forming a pattern of the first embodiment of the present invention;

FIG. 1-3 is a schematic process cross section (No. 3) for explaining the method for forming a pattern of the first embodiment of the present invention;

FIG. 1-4 is a schematic process cross section (No. 4) for explaining the method for forming a pattern of the first embodiment of the present invention;

FIG. 1-5 is a schematic process cross section (No. 5) for explaining the method for forming a pattern of the first embodiment of the present invention;

FIG. 1-6 is a schematic process cross section (No. 6) for explaining the method for forming a pattern of the first embodiment of the present invention;

FIG. 1-7 is a schematic process cross section (No. 7) for explaining the method for forming a pattern of the first embodiment of the present invention;

FIG. 1-8 is a schematic process cross section (No. 8) for explaining the method for forming a pattern of the first embodiment of the present invention;

FIG. 1-9 is a schematic process cross section (No. 9) for explaining the method for forming a pattern of the first embodiment of the present invention;

FIG. 1-10 is a schematic process cross section (No. 10) for explaining the method for forming a pattern of the first embodiment of the present invention;

FIG. 1-11A is a schematic process cross section (No. 11) for explaining the method for forming a pattern of the first embodiment of the present invention;

FIG. 1-11B is a schematic process cross section (No. 11) in a partial expanded form for explaining the method for forming a pattern of the first embodiment of the present invention;

FIG. 1-12 is a schematic process cross section (No. 12) for explaining the method for forming a pattern of the first embodiment of the present invention;

FIG. 2-1 is a schematic process cross section (No. 1) for explaining a method for forming a pattern of a second embodiment of the present invention;

FIG. 2-2 is a schematic process cross section (No. 2) for explaining the method for forming a pattern of the second embodiment of the present invention;

FIG. 2-3 is a schematic process cross section (No. 3) for explaining the method for forming a pattern of the second embodiment of the present invention;

FIG. 2-4 is a schematic process cross section (No. 4) for explaining the method for forming a pattern of the second embodiment of the present invention;

FIG. 2-5 is a schematic process cross section (No. 5) for explaining the method for forming a pattern of the second embodiment of the present invention;

FIG. 2-6 is a schematic process cross section (No. 6) for explaining the method for forming a pattern of the second embodiment of the present invention;

FIG. 2-7 is a schematic process cross section (No. 7) for explaining the method for forming a pattern of the second embodiment of the present invention;

FIG. 2-8 is a schematic process cross section (No. 8) for explaining the method for forming a pattern of the second embodiment of the present invention;

FIG. 2-9 is a schematic process cross section (No. 9) for explaining the method for forming a pattern of the second embodiment of the present invention;

FIG. 2-10 is a schematic process cross section (No. 10) for explaining the method for forming a pattern of the second embodiment of the present invention;

FIG. 2-11 is a schematic process cross section (No. 11) for explaining the method for forming a pattern of the second embodiment of the present invention;

FIG. 2-12A is a schematic process cross section (No. 12) for explaining the method for forming a pattern of the second embodiment of the present invention;

FIG. 2-12B is a schematic process cross section (No. 12) for explaining the method for forming a pattern of the second embodiment of the present invention; and FIG. 2-13 is a schematic process cross section (No. 13) for explaining the method for forming a pattern of the second embodiment of the present invention.

DESCRIPTION OF THE EMBODIMENTS

First Embodiment

FIGS. 1-1 to 1-12 are schematic process cross sections illustrating a method for forming a pattern of a first embodiment of the present invention.

A method for forming a pattern of the first embodiment of the present invention will be described below with reference to FIGS. 1-1 to 1-12.

(Formation of Resist Pattern)

On a substrate 1 as a member to be processed, an ArF organic antireflection film (trade name: ARC29A manufactured by Nissan Chemical Industries, Ltd.) by spin coating. Next, the resultant is baked under conditions of temperature of 215 C and one minute to form an ArF organic antireflection film (antireflection film) 2a having a thickness of 80 nm (refer to FIG. 1-1).

After that, on the ArF organic antireflection film 2a, an ArF positive resist having a nature of changing from a non-soluble state to a soluble state for an alkaline developer by containing an acid additive is coated by spin coating. The resultant is further baked under conditions of temperature of 130 C and one minute, thereby forming an ArF positive resist film 5a having a thickness of 150 nm on the ArF organic antireflection film 2a (refer to FIG. 1-2).

Figure 1:
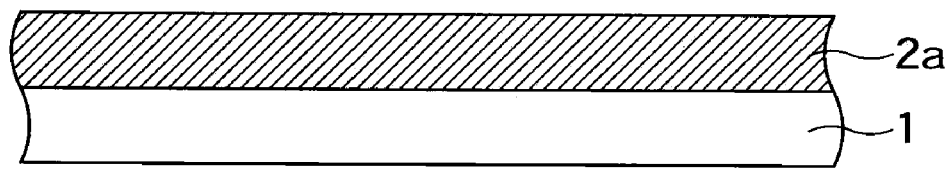
FIG. 1-1 is a schematic process cross section (No. 1) for explaining a method for forming a pattern of a first embodiment of the present invention.
Figures 1, 2:
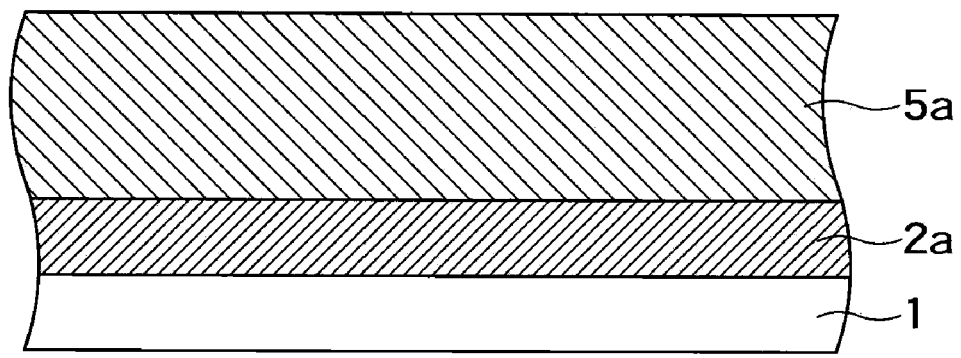
Figures 1, 2, 3:
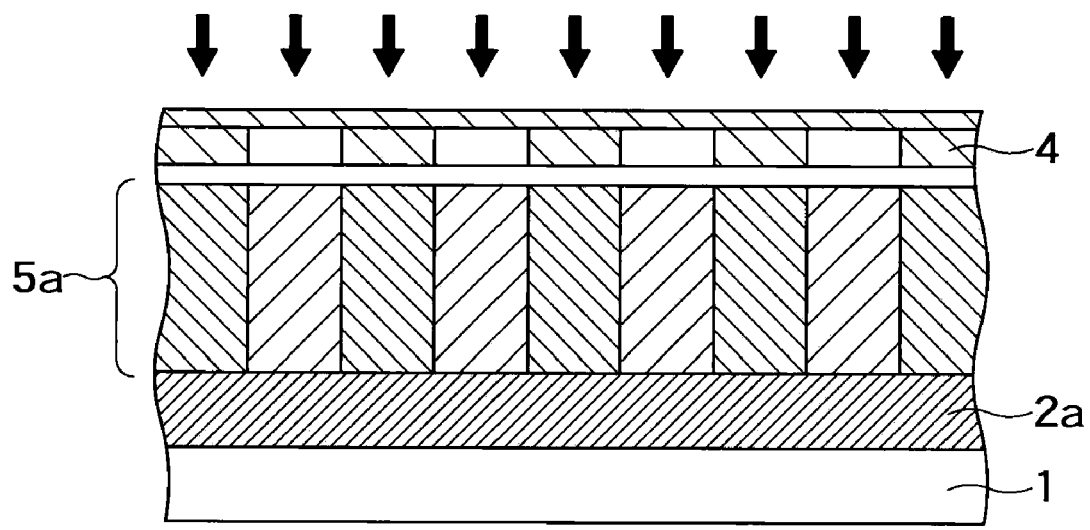
Figures 1, 2, 3, 4:
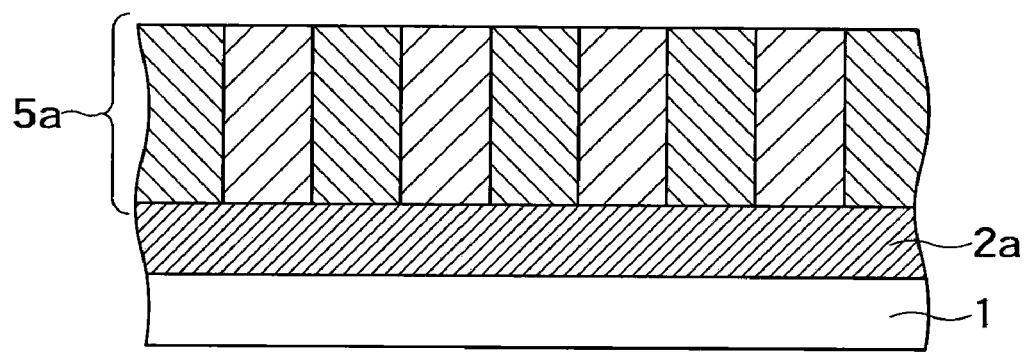
Figures 1, 2, 3, 4, 5:
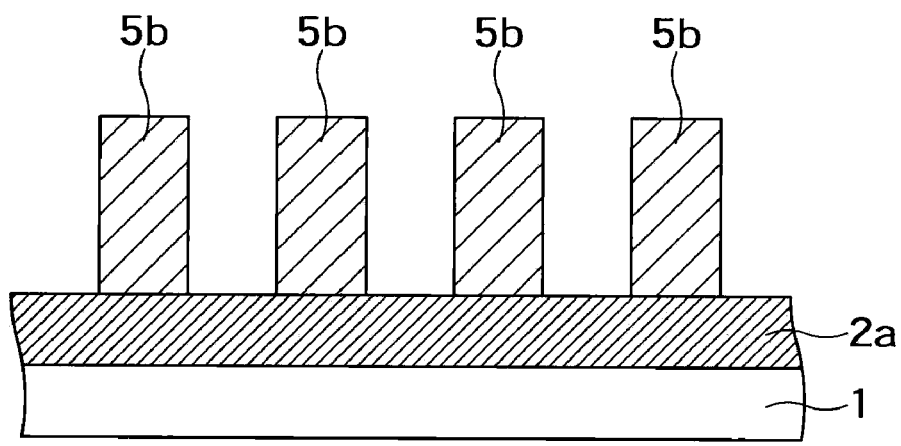
Figures 1, 2, 3, 4, 5, 6:
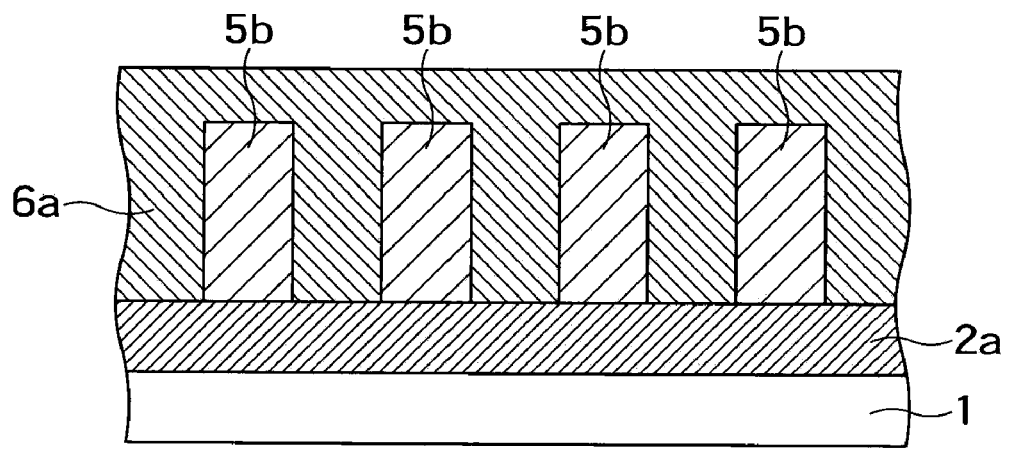
Figures 1, 2, 3, 4, 5, 6, 7:
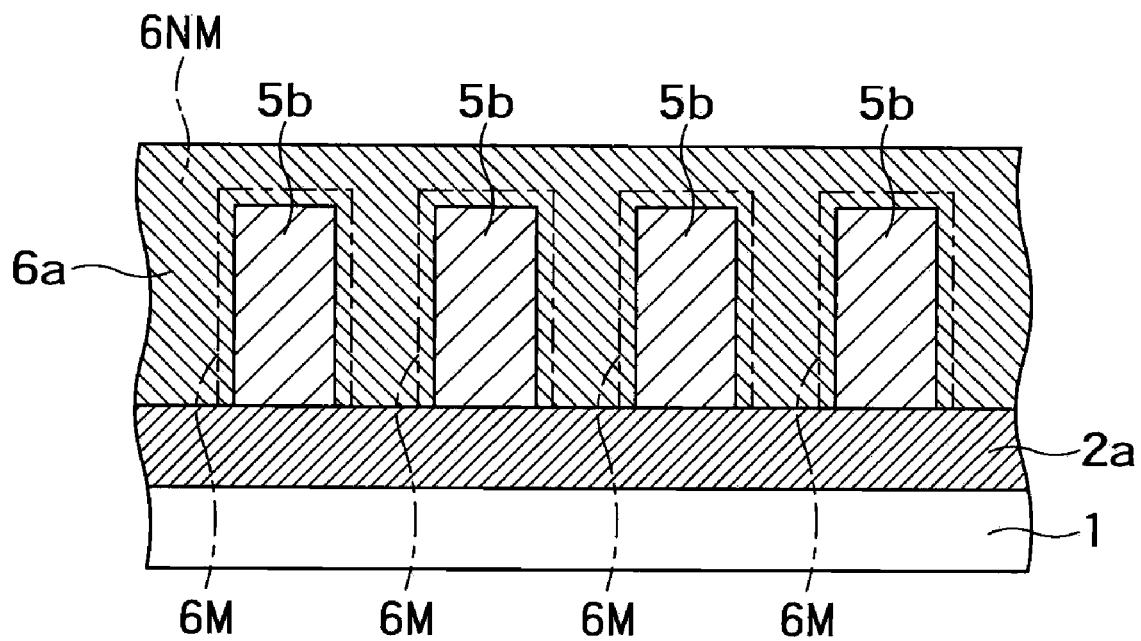
Figures 1, 2, 3, 4, 5, 6, 7, 8:
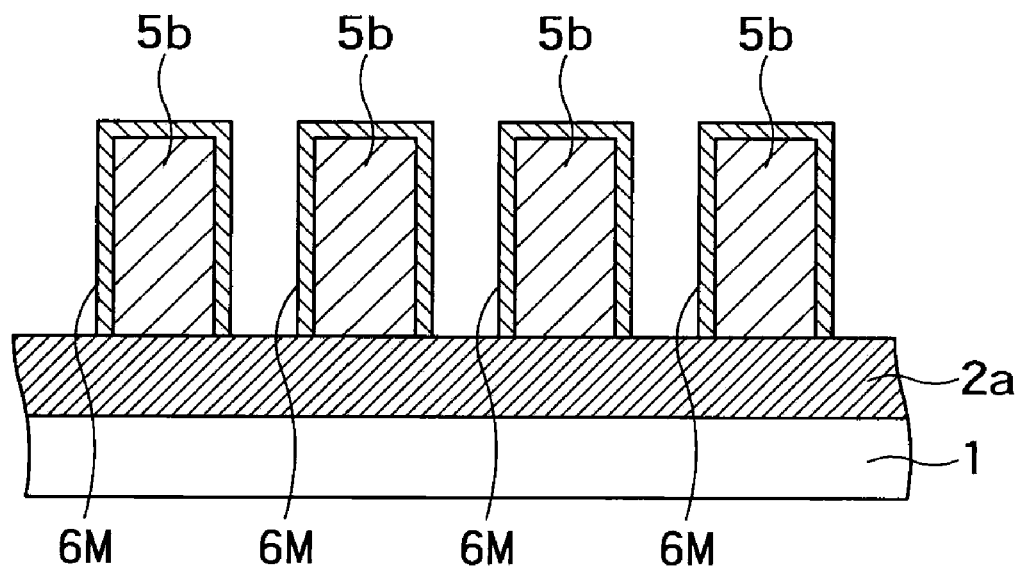
Figures 1, 2, 3, 4, 5, 6, 7, 8, 9:
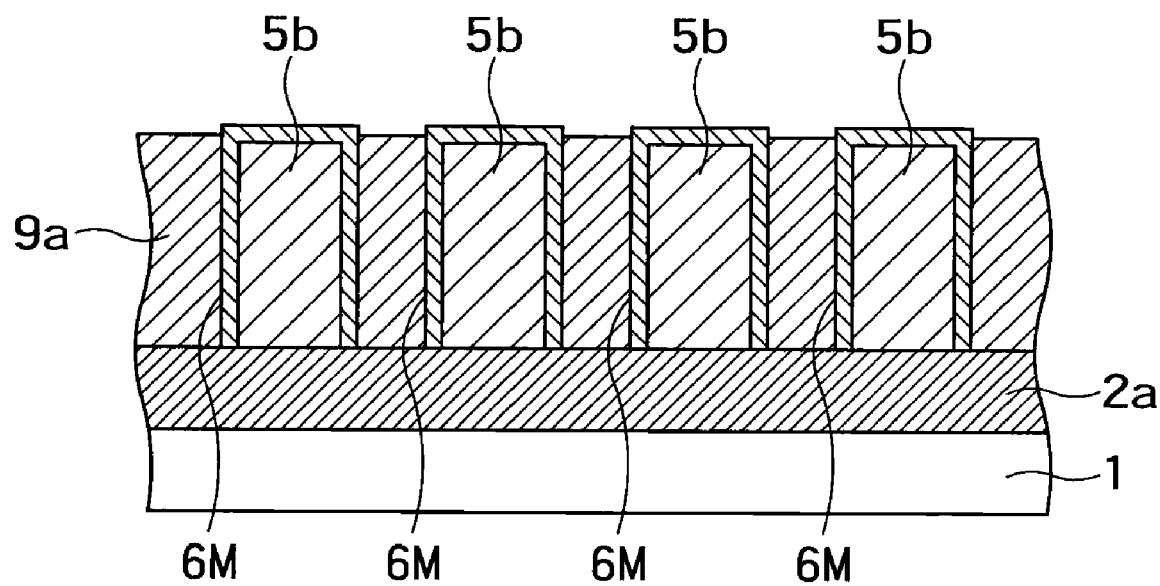
Figures 1, 2, 3, 4, 5, 6, 7, 8, 9, 10:
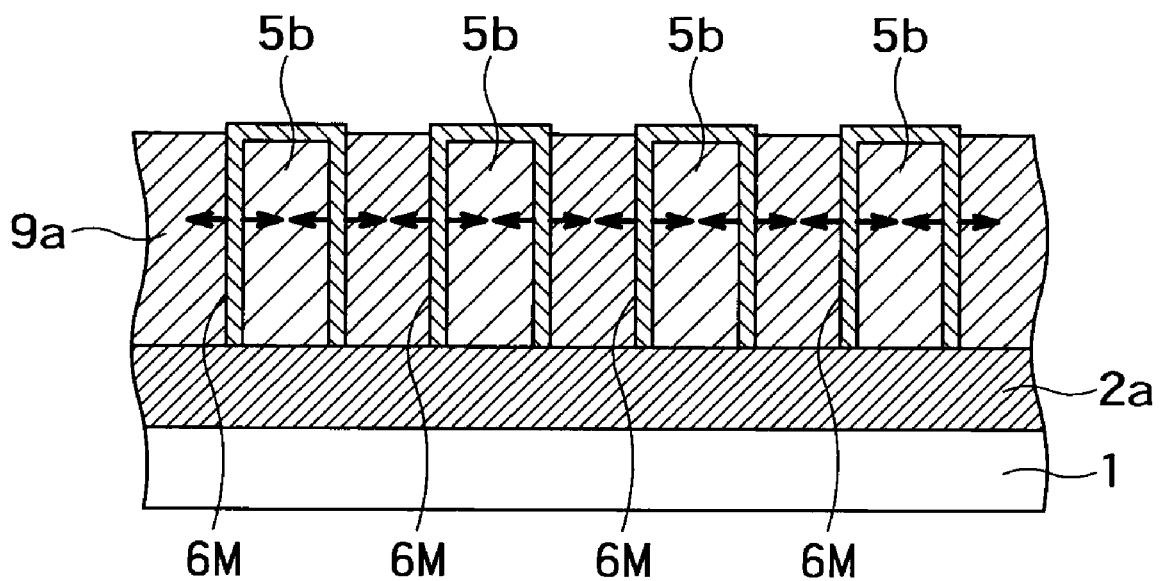
Figures 1, 2, 3, 4, 5, 6, 7, 8, 9, 10, 11, 11A:
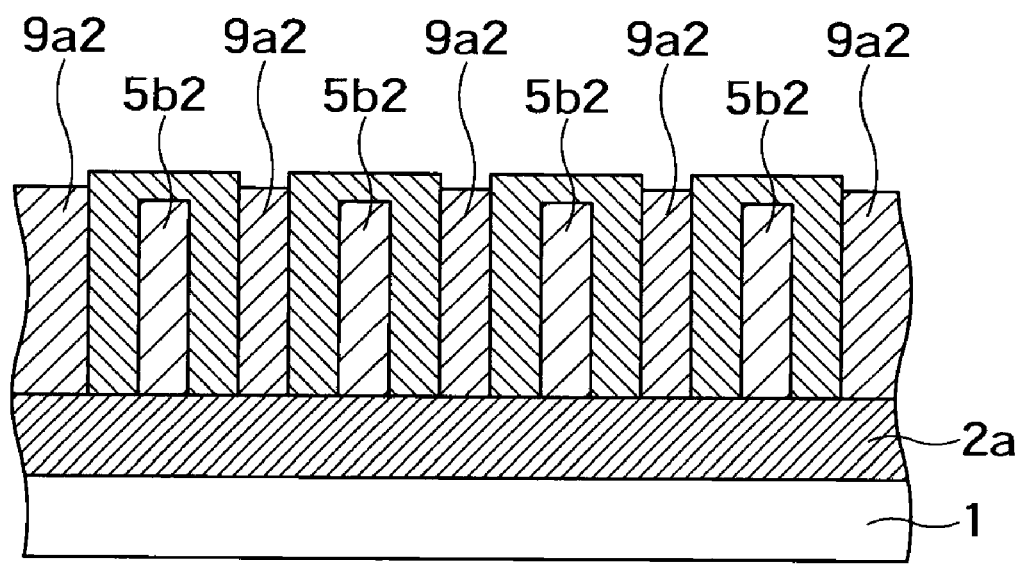
Figures 1, 2, 3, 4, 5, 6, 7, 8, 9, 10, 11, 11B:
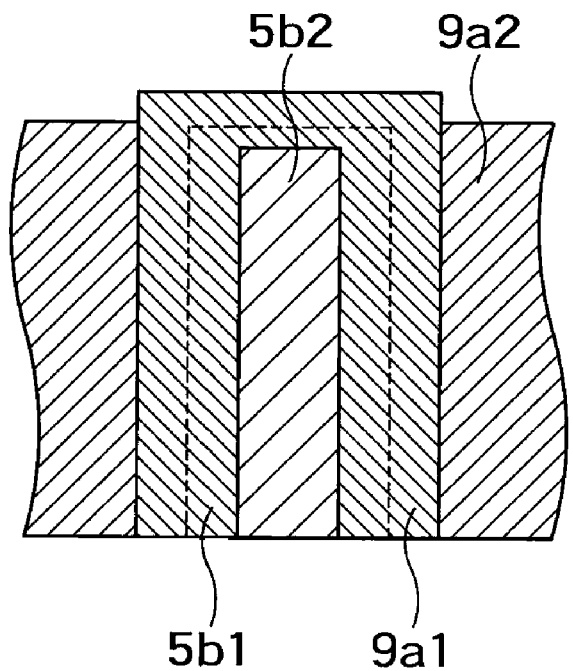
Figures 1, 2, 3, 4, 5, 6, 7, 8, 9, 10, 11, 12:
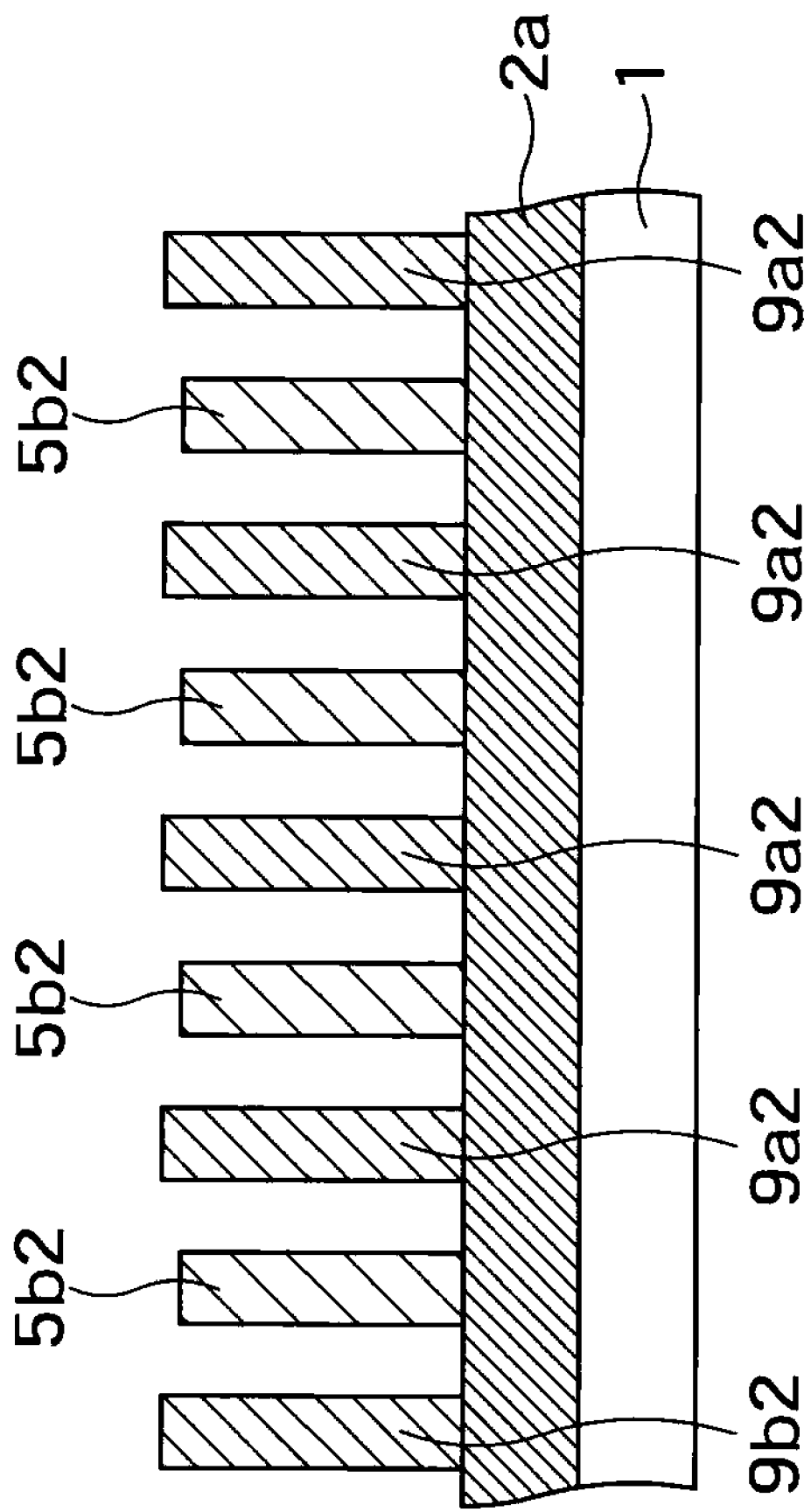
Figures 1, 2:
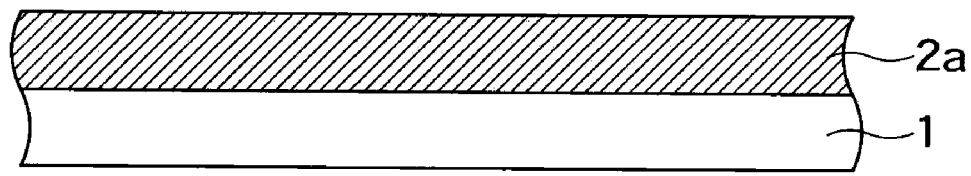
Figure 2:
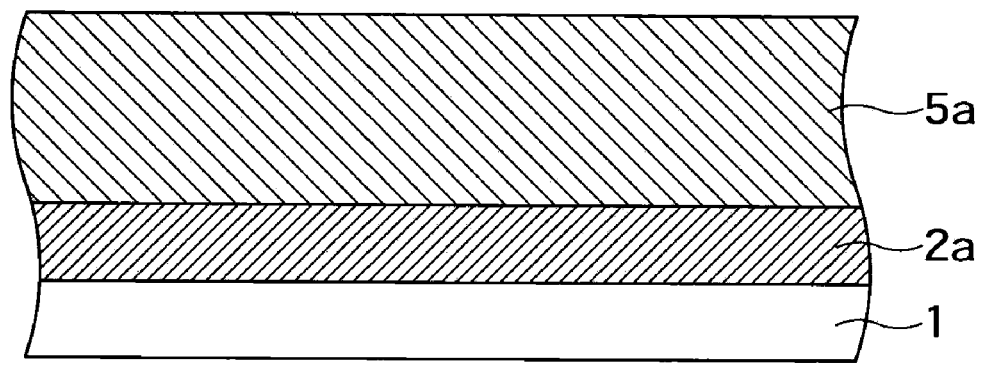
Figures 2, 3:
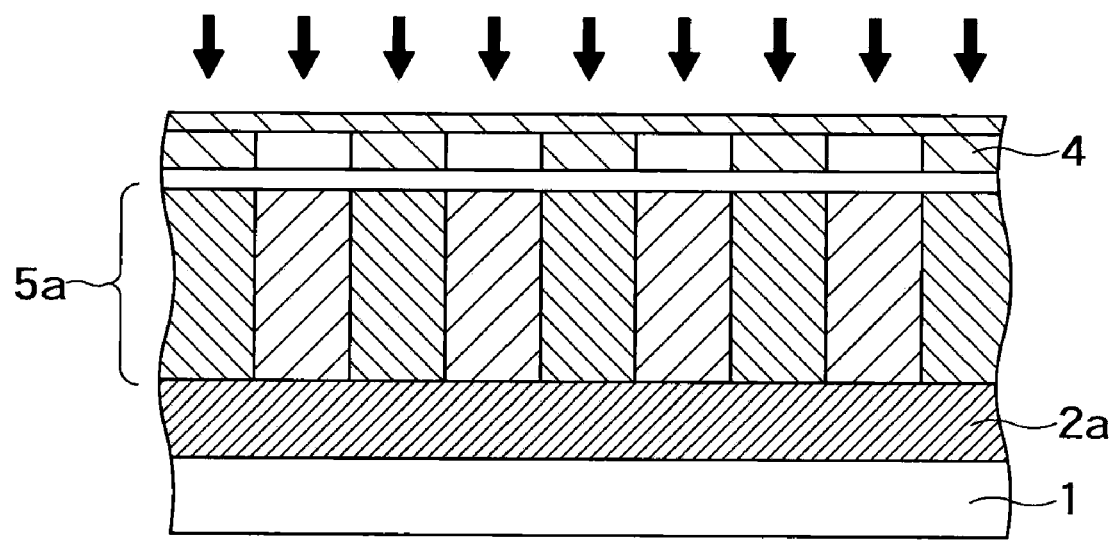
Figures 2, 3, 4:
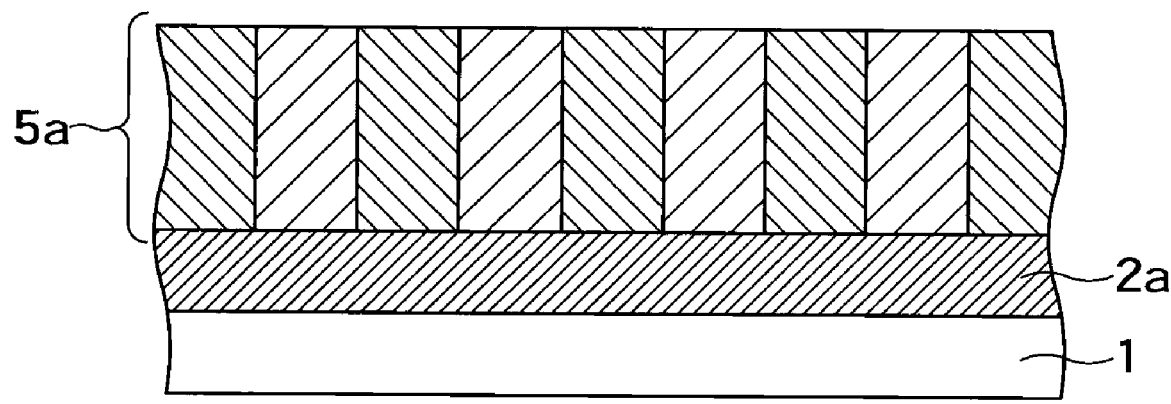
Figures 2, 3, 4, 5:
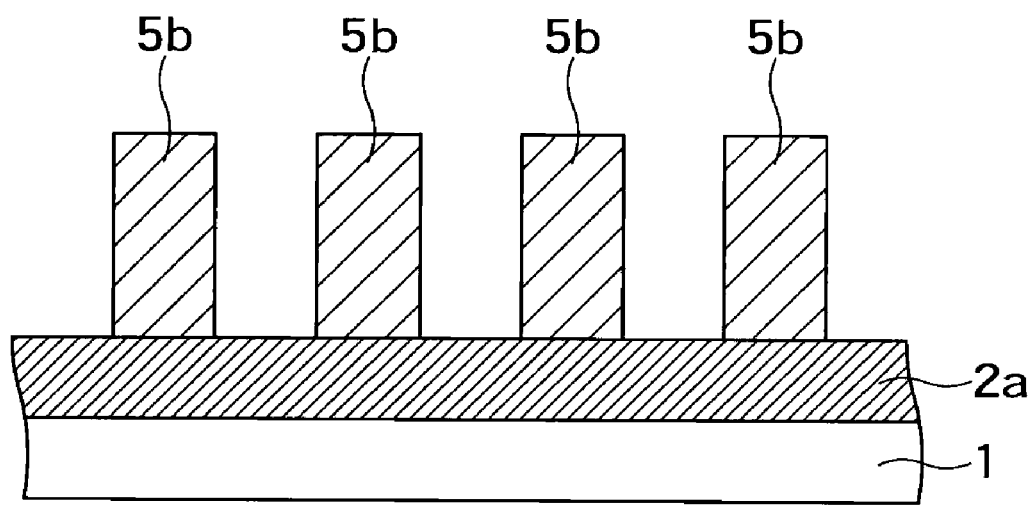
Figures 2, 3, 4, 5, 6:
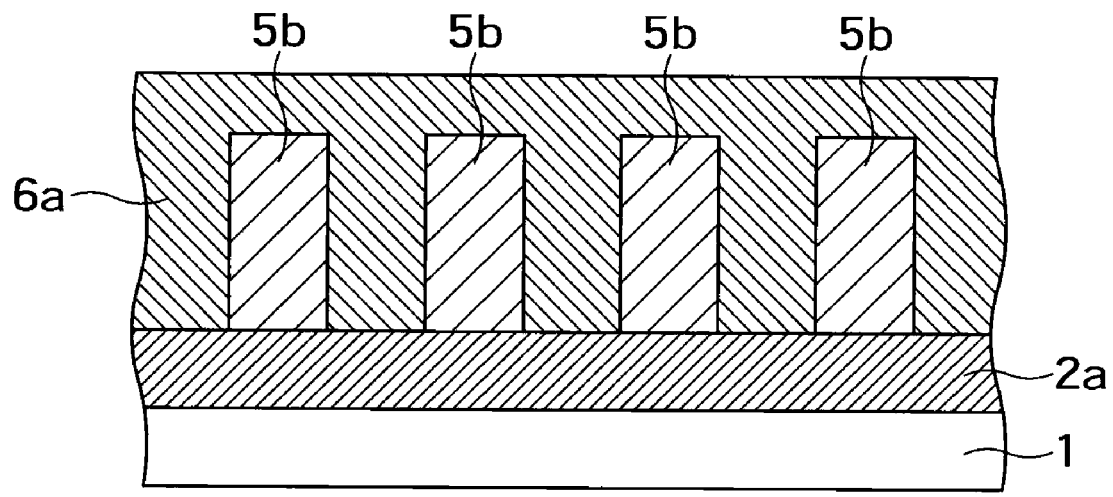
Figures 2, 3, 4, 5, 6, 7:
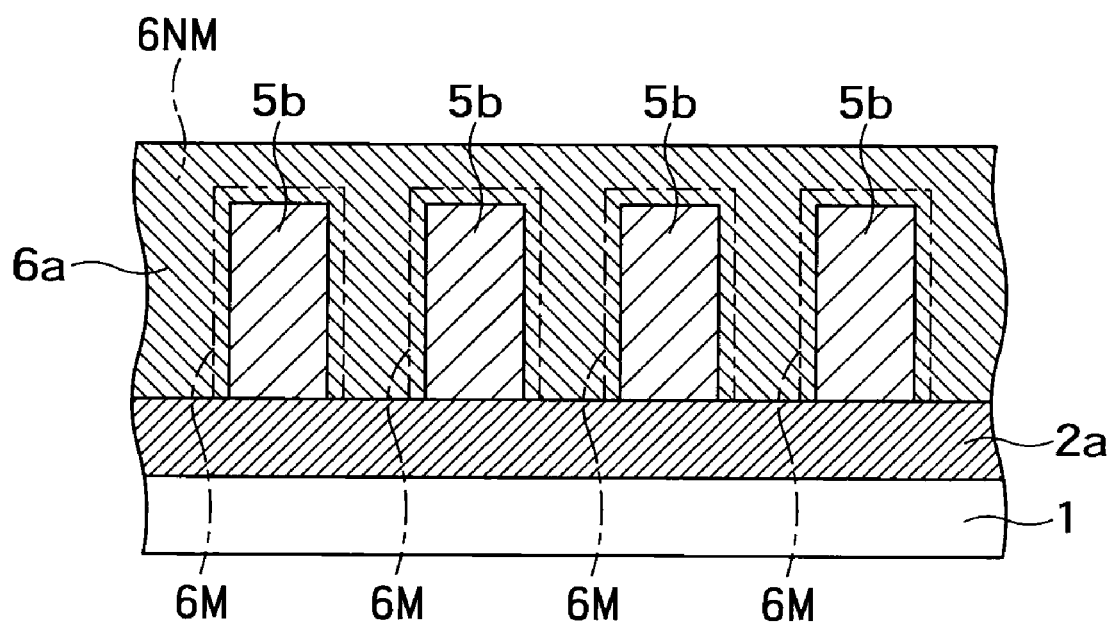
Figures 2, 3, 4, 5, 6, 7, 8:
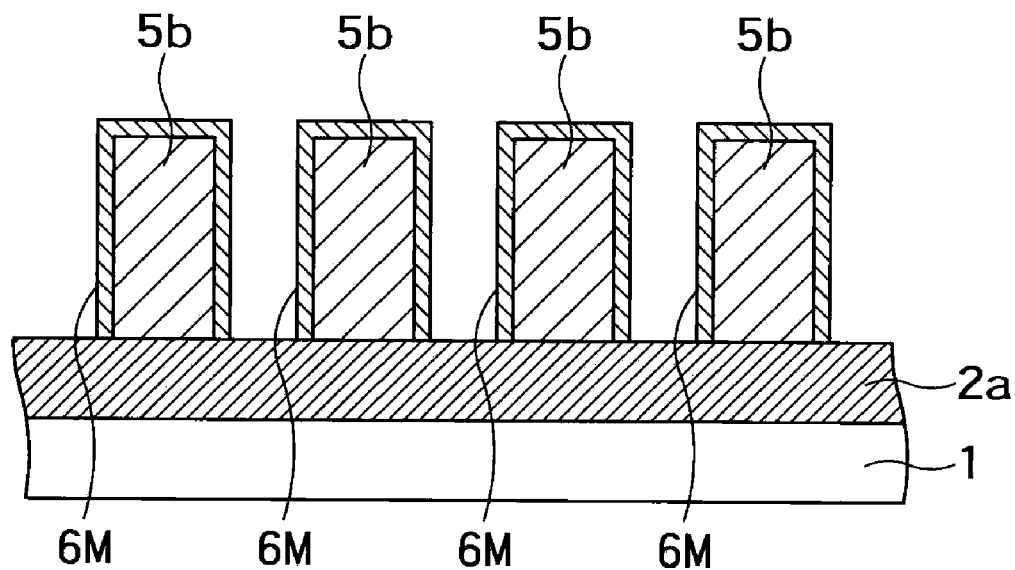
Figures 2, 3, 4, 5, 6, 7, 8, 9:
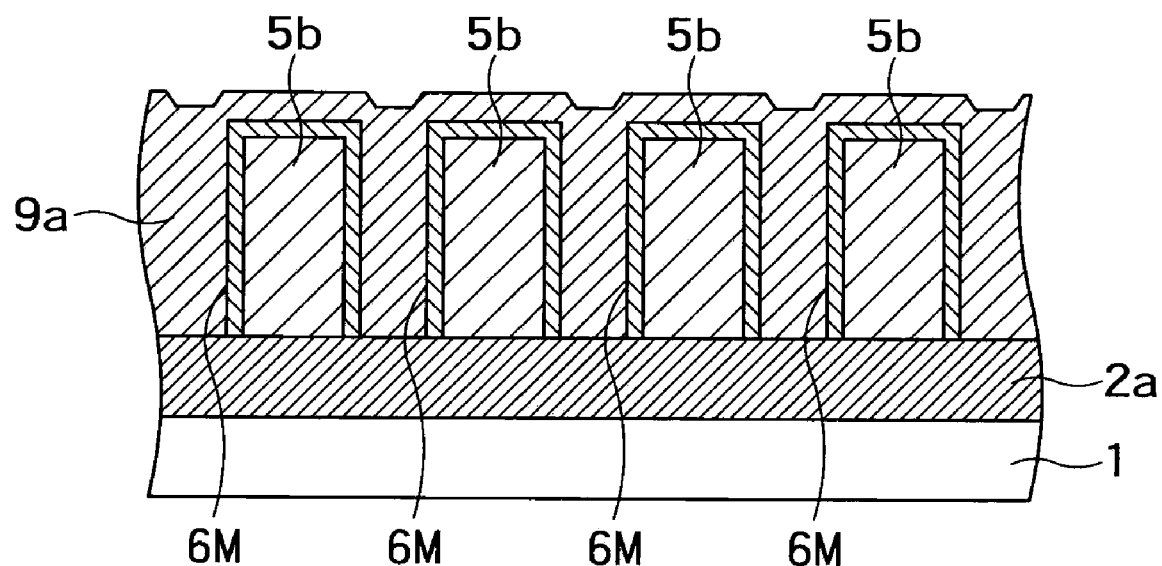
Figures 2, 3, 4, 5, 6, 7, 8, 9, 10:
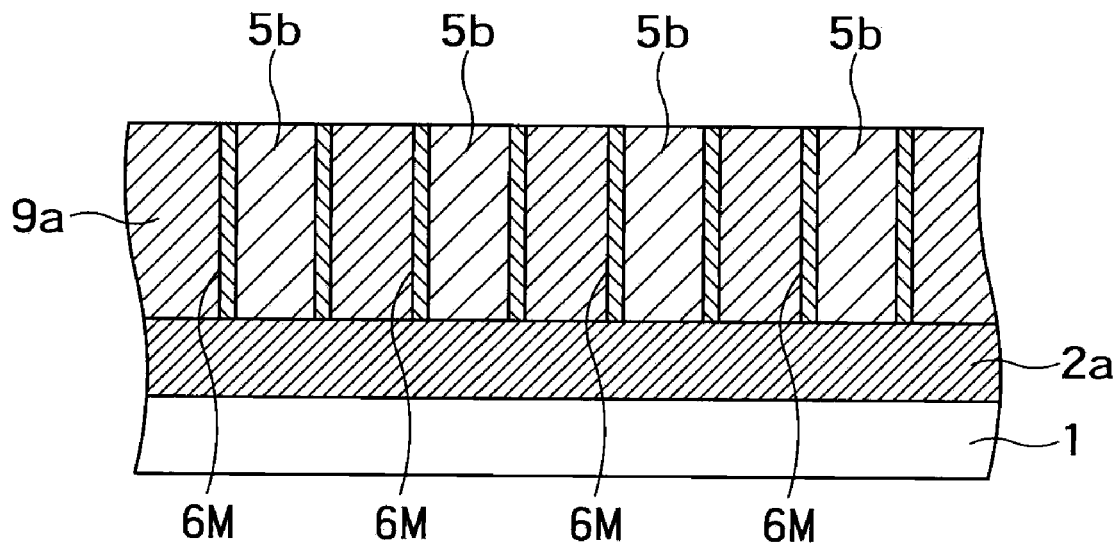
Figures 2, 3, 4, 5, 6, 7, 8, 9, 10, 11:
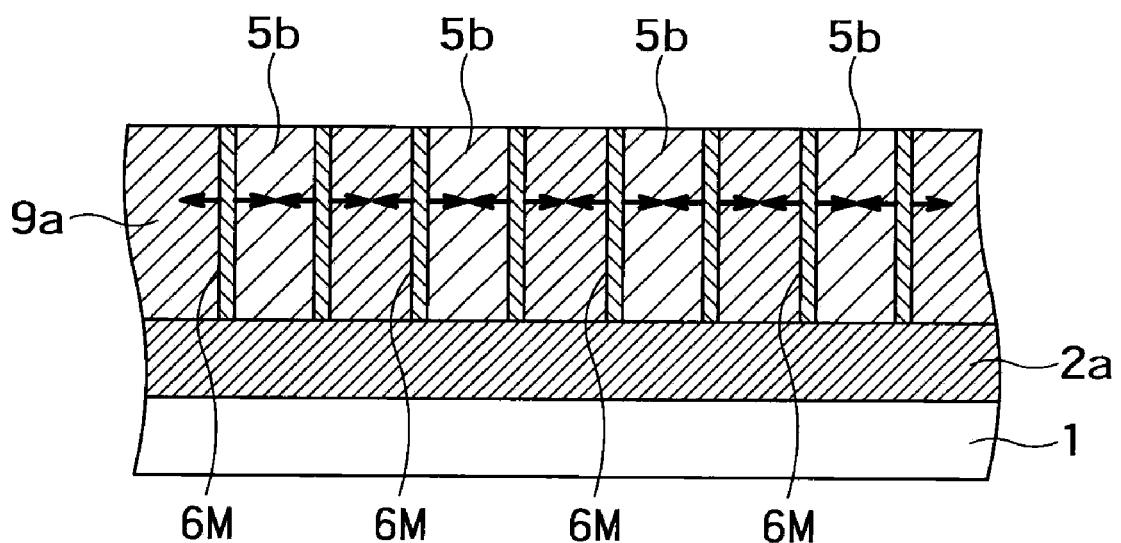
Figures 2, 3, 4, 5, 6, 7, 8, 9, 10, 11, 12, 12A:
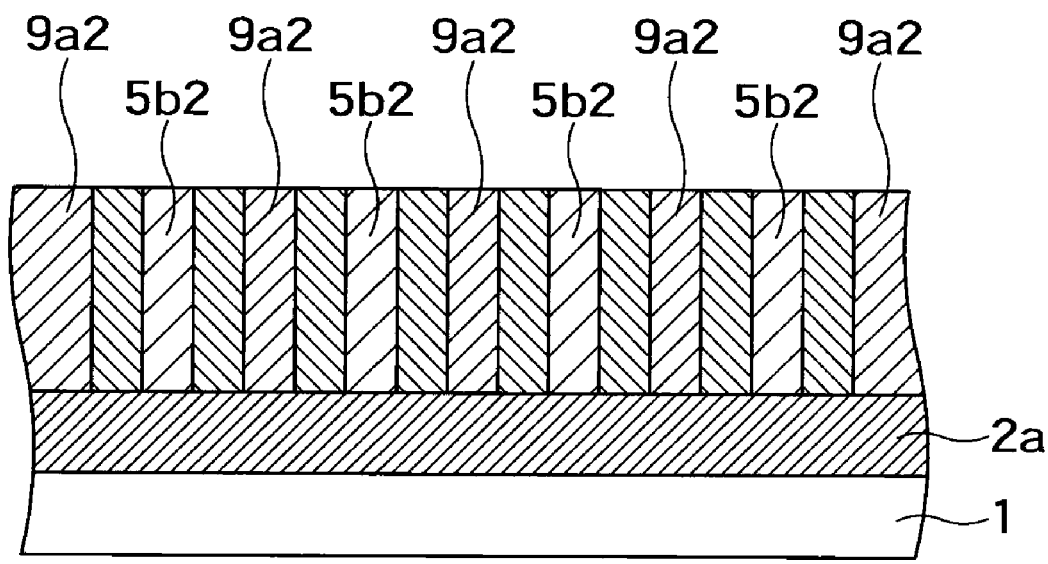
Figures 2, 3, 4, 5, 6, 7, 8, 9, 10, 11, 12, 12B:
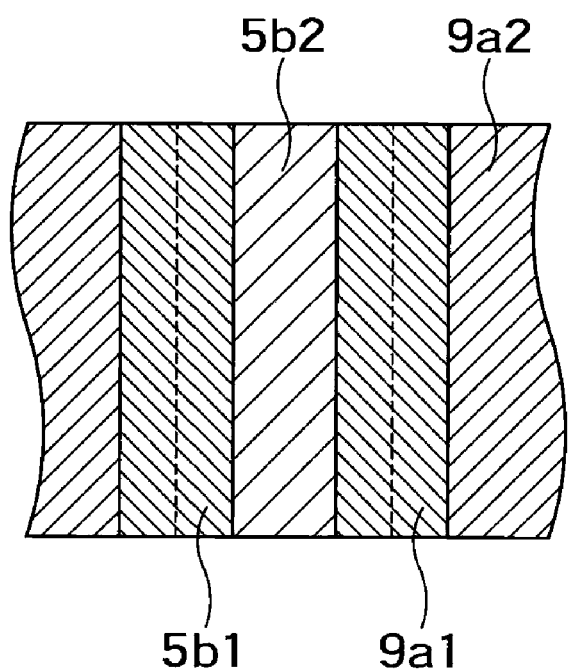
Figures 2, 3, 4, 5, 6, 7, 8, 9, 10, 11, 12, 13:
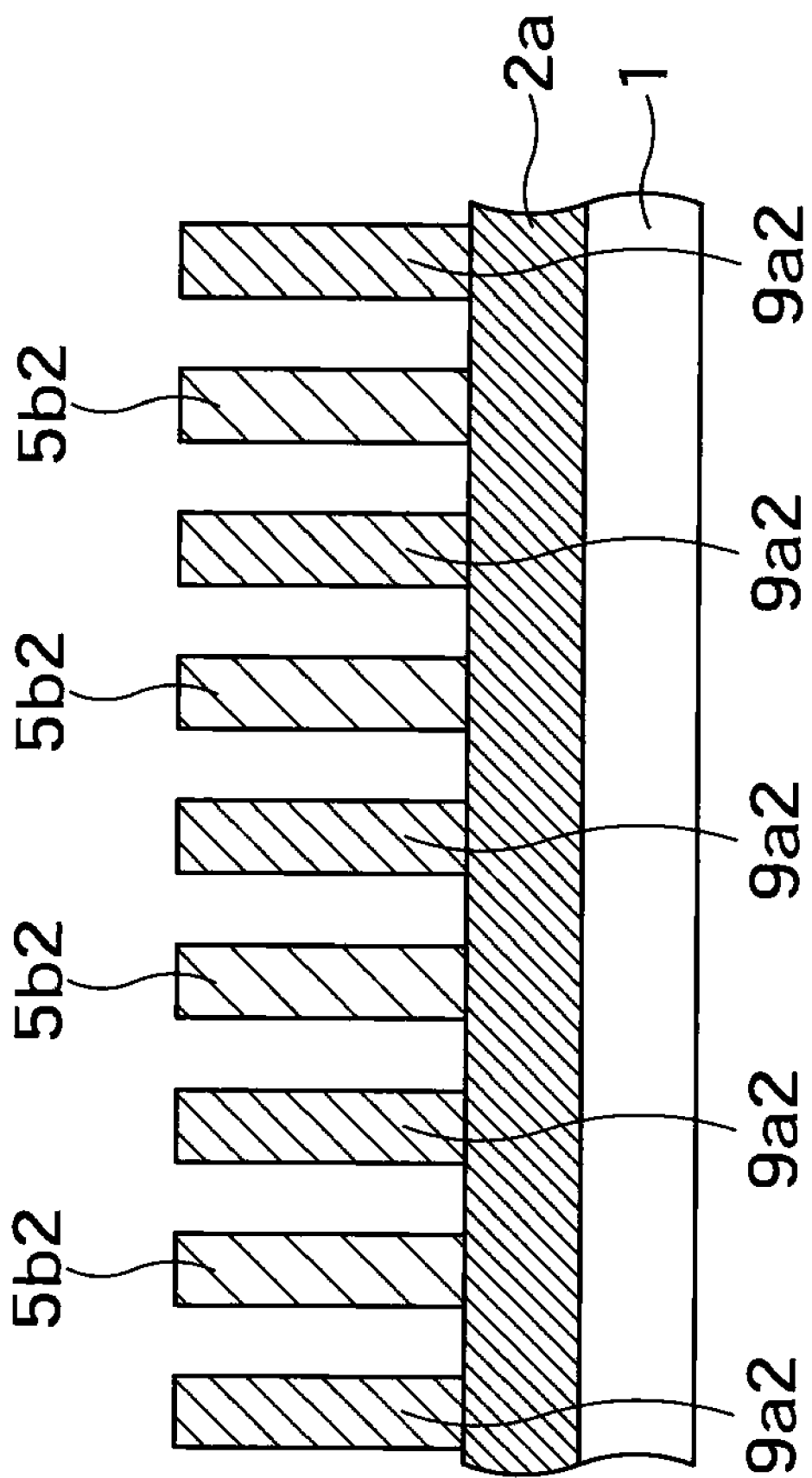

The ArF positive resist film 5a is exposed using a halftone mask 4 having transmittance of 6% under conditions of NA=0.85 and ⅔ annular illumination in an ArF excimer laser exposure apparatus (refer to FIG. 1-3).

Subsequently, the halftone mask 4 is removed and the resultant is baked under conditions of temperature of 100 C and one minute (refer to FIG. 1-4).

Development is performed with a tetramethylammonium hydroxide (TMAH) solution of 2.38 weight %, thereby forming an ArF positive resist pattern (first resist pattern) 5b of 110 nm and 1:1 L/S (refer to FIG. 1-5).

(Addition of Additive)

An application solution (second application solution) containing an acid additive and a water-soluble resin material (second resin film material) is applied so as to bury openings of the ArF positive resist pattern 5b and cover the surface of the ArF positive resist pattern 5b. After that, the resultant is baked under conditions of temperature of 100 C and one minute to form a water-soluble resin film (second resin film) 6a (refer to FIG. 1-6).

At this time, a mixing reaction occurs on an interface between the ArF positive resist pattern 5b and the water-soluble resin film 6a to form additive-containing layers 6M containing the acid additive (refer to FIG. 1-7).

Unreacted portions 6NM in the water-soluble resin film 6a with the ArF positive resist pattern 5b are removed by water washing, and the additive-containing layers 6M are left on the surface of the ArF positive resist pattern 5b (refer to FIG. 1-8). As a result, the acid additive is unevenly distributed on the surface of the ArF positive resist pattern 5b.

(Diffusion of Acid Additive)

Next, a solution (first application solution) containing a resin (first resin film material) and an alcohol solvent (first solvent) is applied on the ArF positive resist pattern 5b covered with the additive-containing layers 6M. The resin has a nature of changing from a non-soluble state to a soluble state for an alkaline developer by containing an acid additive. The resin is a chemically amplified resist which does not contain a photo-acid-generating agent. The alcohol solvent may be properly selected from solvents which do not make the resist dissolved. For example, as an alcohol solvent, it is preferable to use alcohols such as a known solvent for a liquid immersion protection film. More preferably, a monohydroxy alcohol is used. Most preferably, a monohydroxy alcohol having a carbon number of 1 to 10 is used.

As a result, as understood from FIG. 1-9, the above-described solution is sufficiently filled at least in the openings of the ArF positive resist pattern 5b.

The solution is baked under conditions of 100 C and one minute to form a resin film 9a (first resin film) from the solution. The resin film 9a has a nature of changing from a non-soluble state to a soluble state for an alkaline developer by containing an acid additive (refer to FIG. 1-9). The process may be omitted.

Subsequently, the resultant is baked under conditions of 120 C and two minutes, and the acid additive unevenly distributed in the additive-containing layers 6M is diffused to both sides of the additive-containing layers 6M in FIG. 1-10. That is, the acid additive is diffused to both directions to the inside of the resin film 9a and to the inside of the ArF positive resist pattern 5b (refers to FIG. 1-10).

Portions (first additive-diffusing portions) 5b1 in the ArF positive resist pattern 5b and portions (second additive-diffusing portions) 9a1 in the resin film 9a containing the acid additive by the diffusion have a nature that they can be solved in an alkali developer (refer to FIGS. 1-11A and 1-11B).

(Second Pattern Forming Process)

When developing process is performed with the alkaline developer, the portions (first additive-diffusing portions) 5b1 in the ArF positive resist pattern 5b and the portions (second additive-diffusing portions) 9a1 in the resin film 9a containing the acid additive are dissolved (refer to FIGS. 1-11A, 1-11B, and 1-12).

That is, as shown in FIG. 1-12, by the developing process, other portions 9a2 in the resin film 9a and other portions 5b2 in the ArF positive resist pattern 5b which do not dissolve in the alkaline developer remain, and a fine resist pattern (second resist pattern) shown in FIG. 1-12 is obtained. The fine resist pattern in which the remaining portions 9a2 in the resin film 9a and the remaining portions 5b2 in the ArF positive resist pattern 5b are alternatively arranged is obtained. The fine resist pattern is obtained as a pattern having a double pitch (55 nm, 1:1 L/S pattern) of the ArF positive resist pattern 5b initially obtained (refer to FIG. 1-12).

As described above, according to the first embodiment of the present invention, the fine resist pattern can be easily formed.

Second Embodiment

A second embodiment of the present invention will be described below.

The second embodiment is different from the first embodiment with respect to the point that the resin film (first resin film) 9a is planarized by CMP (Chemical Mechanical Polish) (refer to FIGS. 2-9 and 2-10). The other points are substantially the same as those of the first embodiment.

The point is employed in the second embodiment for the following reason.

As shown in FIG. 2-9, the resin film (first resin film) 9a tends to have a risen shape on the ArF positive resist pattern (first resist pattern) 5b. In such a case, the acid additive is not sufficiently diffused in the risen portions in the resin film 9a (refer to FIG. 2-11). The risen portion of the resin film 9a in which the acid additive is not sufficiently diffused is not sufficiently dissolved in a development process step performed after that. Consequently, there is a case that a fine resist pattern having a predetermined shape cannot be obtained (refer to FIG. 2-13). To solve such a problem, in the second embodiment, the risen portions in the resin film 9a is polished and removed by CMP.

The second embodiment of the present invention will be described below with reference to FIGS. 2-1 to 2-13.

The processes shown in FIGS. 2-1 to 2-8 in the second embodiment are similar to those shown in FIGS. 1-1 to 1-8 in the foregoing first embodiment. The processes shown in FIGS. 2-11 to 2-13 in the second embodiment are also similar to those described with reference to FIGS. 1-10 to 1-12 in the first embodiment. In the second embodiment, the processes other than those similar processes will be described. In the second embodiment, the same reference numerals are designated to the same elements as those of the first embodiment.

First, as shown in FIG. 2-8, the ArF positive resist pattern 5b covered with the additive-containing layers 6M is obtained. After that, as shown in FIG. 2-9, the resin film 9a is formed in a shape that the portions in the resin film 9a on the top surface of the ArF positive resist pattern 5b covered with the additive-containing layers 6M are risen. Subsequently, the top surface of the resin film 9a is polished by CMP to remove the risen portions in the resin film 9a and the additive-containing layers 6M positioned on the top surface of the ArF positive resist pattern 5b (refer to FIG. 2-10). In the polishing and removing process, only the risen portions in the resin film 9a positioned on the top surface of the ArF positive resist pattern 5b may be polished and removed to leave the additive-containing layers 6M on the top surface of the ArF positive resist pattern 5b.

After that, the process shown in FIGS. 2-11 to 2-12 is performed and, finally, a pattern shown in FIG. 2-13 is obtained. That is, as shown in FIG. 2-13, also in the second embodiment of the present invention, a fine resist pattern (second resist pattern) can be obtained in a manner similar to that of the first embodiment.

As described above, in the second embodiment of the present invention, a fine resist pattern having a predetermined shape can be easily formed.

Additional advantages and modifications will readily occur to those skilled in the art.

Therefore, the invention in its broader aspects is not limited to the specific details and representative embodiments shown and described herein. Accordingly, various modifications may be made without departing from the spirit or scope of the general inventive concepts as defined by the appended claims and their equivalents.

The invention claimed is:

1. A method for manufacturing a semiconductor device comprising:

forming a resist film on a substrate and processing the resist film to be provided with openings to form a first resist pattern;

forming additive-containing layers so that the additive-containing layers cover a surface of the first resist pattern, the additive-containing layers containing an additive that changes a state of the resist film from a non-soluble state to a soluble state for a developer;

forming a first resin film in a state that the first resin film is buried in the openings of the first resist pattern, a state of the first resin film being changed from a non-soluble state to a soluble state for the developer when the first resin film contains the additive, and the openings of the first resist pattern being covered with the additive-containing layers;

diffusing the additive into the first resist pattern and the first resin film, respectively, the first resist pattern being covered with the additive-containing layers and being medially-located to the additive-containing layers, and the first resin film being laterally-located to the additive-containing layers, to form first additive-diffusing portions in the first resist pattern and second additive-diffusing portions in the first resin film, the first and second additive-diffusing portions being able to be solved in the developer; and removing the first additive-diffusing portions and the second additive-diffusing portions with the developer, to form a second resist pattern made of remaining portions in the first resist pattern and remaining portions in the first resin film.

2. The method for manufacturing a semiconductor device according to claim 1, wherein an acid additive is used as the additive and an alkaline solution is used as the developer.

3. The method for manufacturing a semiconductor device according to claim 1, wherein a chemically-amplified resist film is used as the resist film.

4. The method for manufacturing a semiconductor device according to claim 1, wherein the first resist pattern is formed by forming, exposing and developing the resist film on the substrate.

5. The method for manufacturing a semiconductor device according to claim 1, wherein the first resist pattern is formed by forming and processing the resist film on an antireflection film formed on the substrate.

6. The method for manufacturing a semiconductor device according to claim 1, wherein the additive-containing layers are formed through burying a second application solution at least in the openings of the first resist pattern, the second application solution containing a second resin film material and the additive, heating to form a second resin film from the second application solution and cause a mixing reaction to form the additive-containing layers, the second resin film containing the additive, and the mixing reaction being caused on an interface portion between the first resist pattern and the second resin film, and removing unreacted portions other than the additive-containing layers in the second resin film to form the additive-containing layers in a state that the additive-containing layers cover the surface of the first resist pattern.

7. The method for manufacturing a semiconductor device according to claim 6, wherein water-soluble resin is used as the second resin film material.

8. The method for manufacturing a semiconductor device according to claim 1, wherein the additive-containing layers are formed through burying a second application solution at least in the openings of the first resist pattern, the second application solution containing a second resin film material and the additive, heating to form a second resin film from the second application solution and cause a mixing reaction to form the additive-containing layers, the second resin film containing the additive, and the mixing reaction being caused on an interface portion between the first resist pattern and the second resin film, and removing unreacted portions other than the additive-containing layers in the second resin film with water washing to form the additive-containing layers in a state that the additive-containing layers cover the surface of the first resist pattern.

9. The method for manufacturing a semiconductor device according to claim 1, wherein a chemically-amplified resist film which does not contain a photo-acid-generating agent is used as the first resin film.

10. The method for manufacturing a semiconductor device according to claim 1, wherein the first resin film is formed by burying a first application solution in the openings of the first resist pattern, the first application solution containing a first resin film material and a first solvent, and the first resist pattern being covered with the additive-containing layers.

11. The method for manufacturing a semiconductor device according to claim 10, wherein the first resin film is formed by heating the first application solution.

12. The method for manufacturing a semiconductor device according to claim 10, wherein monohydroxy alcohol is used as the first solvent.

13. The method for manufacturing a semiconductor device according to claim 1, wherein the first resin film is formed through forming a first application solution so that the first application solution is buried in the openings of the first resist pattern covered with the additive-containing layers and the first application solution covers the top surface of the first resist pattern covered with the additive-containing layers, the first application solution containing a first resin film material and a first solvent.

14. The method for manufacturing a semiconductor device according to claim 13, wherein the first resin film is formed by heating the first application solution.

15. The method for manufacturing a semiconductor device according to claim 13, wherein, before the additive diffuses into the first resin film, potions of the first resin film are removed, the portions of the first resin film being positioned on the top surface of the first resist pattern covered with the additive-containing layers.

16. The method for manufacturing a semiconductor device according to claim 15, wherein the portions of the first resin film are removed by chemical mechanical polish.

17. The method for manufacturing a semiconductor device according to claim 15, wherein, after the portions of the first resin film positioned on the top surface of the first resist pattern are removed, portions of the additive-containing layers are removed to expose the top surface of the first resist pattern, the portions of the additive-containing layers being positioned on the top surface of the first resist pattern.

18. The method for manufacturing a semiconductor device according to claim 17, wherein the portions of the additive-containing layers are removed by chemical mechanical polish.

19. The method for manufacturing a semiconductor device according to claim 1, wherein the first additive-diffusing portions and the second additive-diffusing portions are formed by heating to diffuse the additive, the first additive-diffusing portions and the second additive-diffusing portions being able to be solved in the developer.

20. The method for manufacturing a semiconductor device according to claim 1, wherein processes are performed so that width of each of the openings of the first resist pattern, first diffusion depth, and second diffusion depth become the same predetermined value, to form width of each of the remaining portions in the first resist pattern, width of each of the remaining portions in the first resin film, and gap width between each of the remaining portions in the first resist pattern and each of the remaining portions in the first resin film, as the same value, the width of each of the remaining portions in the first resist pattern and the width of each of the remaining portions in the first resin film being a pattern width of the second resist pattern, the gap width between each of the remaining portions in the first resist pattern and each of the remaining portions in the first resin film being a pattern gap of the second resist pattern, the first diffusion depth being diffusion depth of the additive diffused into the first resist pattern which is medially-located to the additive-containing layers, and the second diffusion depth being diffusion depth of the additive diffused into the first resin film which is laterally-located to the additive-containing layers.

* * * * *